(12) United States Patent
Sridharan et al.

(10) Patent No.: US 11,031,358 B2
(45) Date of Patent: Jun. 8, 2021

(54) OVERHANG MODEL FOR REDUCING PASSIVATION STRESS AND METHOD FOR PRODUCING THE SAME

(71) Applicant: MARVELL INTERNATIONAL LTD., Hamilton (BM)

(72) Inventors: Aarthi Sridharan, Singapore (SG); Gong Cheng, Singapore (SG); Premachandran Chirayarikathuveedu, Clifton Park, NY (US); Fahad Mirza, Clifton Park, NY (US); Carole Graas, Ballston Spa, NY (US); Sricharan Tubati, Singapore (SG); Nurul Islam Mohd, Singapore (SG)

(73) Assignee: MARVELL ASIA PTE, LTD., Singapore (SG)

( * ) Notice: Subject to any disclaimer, the term of this patent is extended or adjusted under 35 U.S.C. 154(b) by 0 days.

(21) Appl. No.: 15/909,684

(22) Filed: Mar. 1, 2018

(65) Prior Publication Data

US 2019/0273051 A1    Sep. 5, 2019

(51) Int. Cl.
*H01L 23/00*    (2006.01)
*H01L 23/31*    (2006.01)
(Continued)

(52) U.S. Cl.
CPC ........ *H01L 23/564* (2013.01); *H01L 21/0217* (2013.01); *H01L 21/02164* (2013.01);
(Continued)

(58) Field of Classification Search
CPC ........ G06F 21/32; G06F 3/041; G06F 1/1637; G06F 3/0443; H01L 27/14636; H01L 27/14634; H01L 27/1464; H01L 27/1469
See application file for complete search history.

(56) References Cited

U.S. PATENT DOCUMENTS

| 5,821,174 A | 10/1998 | Hong et al. |
| 6,017,614 A | 1/2000 | Tsai et al. |

(Continued)

FOREIGN PATENT DOCUMENTS

| TW | 200701094 A | 1/2007 |
| TW | 201246410 A1 | 11/2012 |

(Continued)

OTHER PUBLICATIONS

Office Action for the related Taiwanese patent application No. 107113836, dated Nov. 27, 2018, 7 pages.

*Primary Examiner* — Marcos D. Pizarro
*Assistant Examiner* — Quinton A Brasfield

(57) ABSTRACT

A method for forming a sensor with increased overhang to prevent passivation stress fractures is provided. Embodiments include forming a first passivation layer over a dielectric layer patterned over a first top metal layer of a logic region of a sensor and a second top metal layer of an array region of the sensor; planarizing the first passivation layer and the dielectric layer to form a level surface above the first top metal layer and the second top metal layer; etching the dielectric layer to form a pad opening in the array region of the sensor based on a predetermined overhang value, the pad opening exposing a portion of the surface of the second top metal layer; and forming a second passivation layer over the level surface and the pad opening in the array region.

7 Claims, 9 Drawing Sheets

(51) Int. Cl.
   *H01L 21/768* (2006.01)
   *H01L 21/02* (2006.01)
(52) U.S. Cl.
   CPC .. *H01L 21/02211* (2013.01); *H01L 21/02274* (2013.01); *H01L 21/7682* (2013.01); *H01L 21/76832* (2013.01); *H01L 21/76834* (2013.01); *H01L 23/3171* (2013.01); *H01L 23/3192* (2013.01)

(56) References Cited

U.S. PATENT DOCUMENTS

| | | | |
|---|---|---|---|
| 6,358,862 B1 | 3/2002 | Ireland et al. | |
| 2008/0032438 A1* | 2/2008 | Wen | H01L 27/14623 |
| | | | 438/60 |
| 2008/0116537 A1* | 5/2008 | Adkisson | H01L 27/14618 |
| | | | 257/448 |
| 2011/0267512 A1* | 11/2011 | Toumiya | H01L 27/14625 |
| | | | 348/294 |
| 2013/0203209 A1* | 8/2013 | Park | H01L 27/1463 |
| | | | 438/73 |
| 2014/0124888 A1* | 5/2014 | Choi | H01L 27/14636 |
| | | | 257/432 |
| 2017/0338273 A1* | 11/2017 | Fujiwara | H01L 21/78 |
| 2017/0343498 A1* | 11/2017 | Kalnitsky | H01L 29/78696 |
| 2018/0286900 A1* | 10/2018 | Chen | H01L 27/1464 |

FOREIGN PATENT DOCUMENTS

| | | |
|---|---|---|
| TW | 201644026 A | 12/2016 |
| TW | 201729139 A | 8/2017 |
| TW | 201730810 A | 9/2017 |
| TW | 201802723 A | 1/2018 |

* cited by examiner

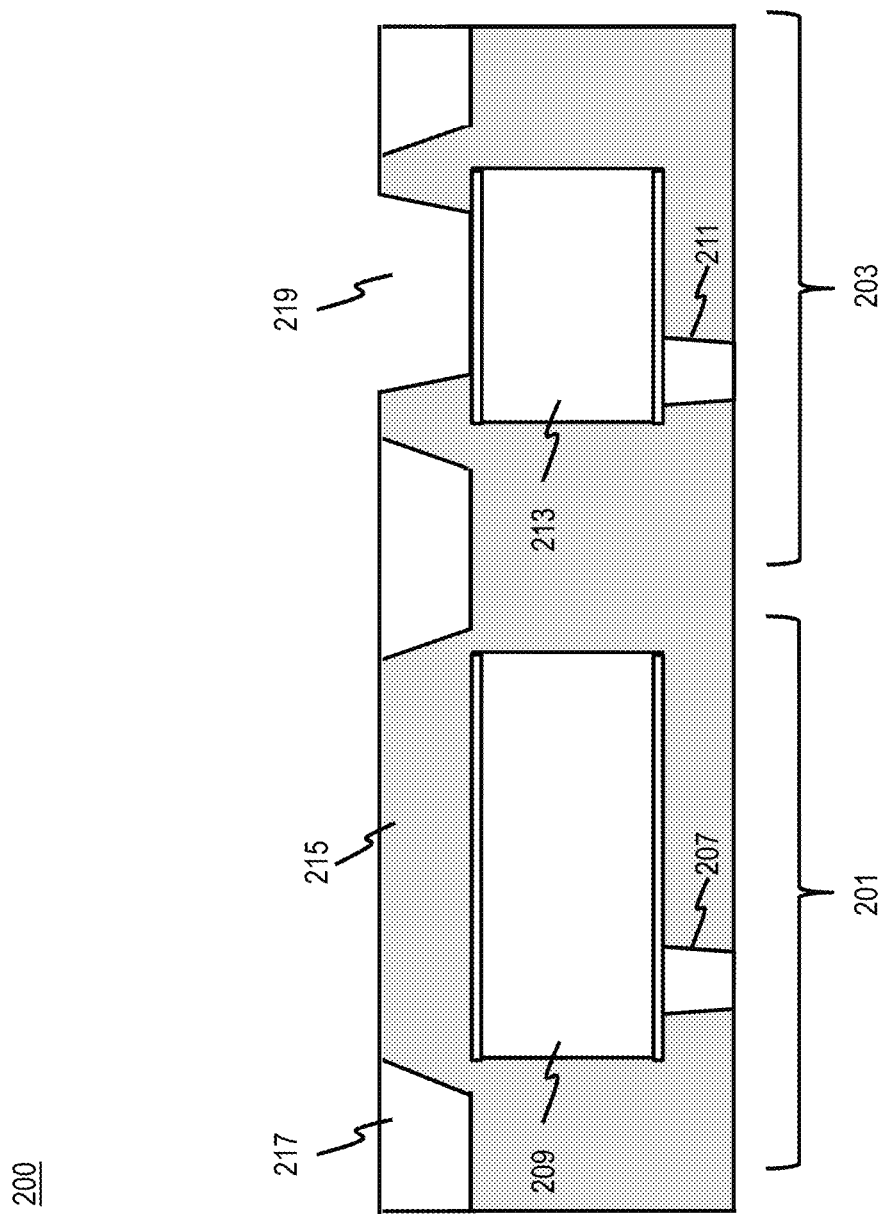

OVERHANG MODEL FOR REDUCING PASSIVATION STRESS AND METHOD FOR PRODUCING THE SAME

TECHNICAL FIELD

The present disclosure relates to semiconductor fabrication. In particular, the present disclosure relates to reducing passivation stress within a fingerprint sensor.

BACKGROUND

Fingerprint sensing semiconductors are widely used in computing devices to support fingerprint scanning applications. The sensors are typically embedded under a display, behind a metal shell or within a frame of the computing device. Dual pad mask passivation is performed during the sensor fabrication process to protect it from moisture, corrosion and other external stimuli and increase their sensibility to touch. Per this approach, a thin passivation layer is deposited on top of a planarized passivation pattern formed over the semiconductor. Unfortunately, this passivation scheme often results in the formation of stress fractures in the most vulnerable areas of the thin upper passivation film, which in turn degrades the integrity of the passivation layer.

One approach for addressing this issue is to increase the upper passivation oxide thickness. However, the increased thickness reduces sensor performance and increases production cost. A need therefore exists for a device and method of forming a sensor with structural features to prevent passivation stress fractures with minimal cost.

SUMMARY

An aspect of the present disclosure is a method of forming a sensor with structural features to prevent passivation stress fractures with minimal cost.

Another aspect of the present disclosure is a sensor with increased overhang to prevent passivation stress fractures.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a first passivation layer over a dielectric layer patterned over a first top metal layer of a logic region of a sensor and a second top metal layer of an array region of the sensor; planarizing the first passivation layer and the dielectric layer to form a level surface above the first top metal layer and the second top metal layer; etching the dielectric layer to form a pad opening in the array region of the sensor based on a predetermined overhang value, the pad opening exposing a portion of the surface of the second top metal layer; and forming a second passivation layer over the level surface and the pad opening in the array region.

Aspects of the present disclosure includes etching the second passivation layer and the dielectric layer under the second passivation layer to form a pad opening in the logic region of the sensor based on the predetermined overhang value, the pad opening exposing a portion of the surface of the first top metal layer. Further aspects include, the step of etching further including: depositing an etch mask over a portion of the second passivation layer, wherein the deposition is based on the dimensions of the pad opening in the logic region of the sensor. Another aspect includes the dimensions of the pad opening in the logic region are based on the predetermined overhang value, and wherein the predetermined overhang value is a measure of overlap between the first top metal layer and the second passivation layer from the pad opening.

Additional aspects include, the step of etching further including: depositing an etch mask over a portion of the dielectric layer and the first passivation layer, wherein the deposition is based on the dimensions of the pad opening in the array region of the sensor. Another aspect includes the dimensions of the pad opening in the array region are based on the predetermined overhang value, and wherein the predetermined overhang value is a measure of overlap between the second top metal layer and the second passivation layer from the pad opening.

Additional aspects include the predetermined overhang value is based on a correlation between a deformation shape of the first top metal layer or the second top metal layer and a deformation behavior of the second passivation layer leading to stress optimization in the second passivation layer. Another aspect includes the correlation is based on finite element analysis (FEA). Another aspect includes the dielectric layer which includes a high-density plasma (HDP) oxide, a silicon or doped silicon-based low-K dielectric. Further aspect includes the first passivation layer which includes tetraethoxysilane (TEOS) and the second passivation layer which includes a HDP oxide and nitride.

Another aspect of the present disclosure is a device including: a first top metal layer within a logic region of a sensor; a second top metal layer within an array region of the sensor; a dielectric layer over the logic region and the array region, height of the dielectric layer over the first and second top metal layers greater than the height of the dielectric layer in-between and around the first and second top metal layers; a first passivation layer over the dielectric layer in-between and around the first and second top metal layers, height of the first passivation layer level with the height of the dielectric layer over the first and second top metal layers; a pad opening in the logic region of the sensor with dimensions based on a predetermined overhang value, the pad opening exposing the first top metal layer; a pad opening in the array region of the sensor with dimensions based on the predetermined overhang value; and a second passivation layer over the dielectric layer, the first passivation layer and the pad opening in the array region of the sensor.

Aspects of the device include a via connected to a bottom surface of the first top metal layer, the via interconnecting the sensor to a logic device; and a via connected to a bottom surface of the second top metal layer, the via interconnecting the sensor to an array, wherein the dielectric layer is over the via, and wherein the dielectric layer includes HDP oxide, silicon or doped silicon-based low-K dielectric. Another aspect includes an etch mask over a portion of the dielectric layer and the first passivation layer, wherein the portion is based on the dimensions of the pad opening in the array region of the sensor. A further aspect includes an etch mask over a portion of the second passivation layer, wherein the portion is based on the dimensions of the pad opening in the logic region of the sensor. Other aspects include the predetermined overhang value is a measure of overlap between the second top metal layer and the second passivation layer from the pad opening in the array region. A further aspect includes the predetermined overhang value is a measure of overlap between the first top metal layer and the second passivation layer from the pad opening in the logic region.

Additional aspects include, the first passivation layer which includes TEOS and the second passivation layer which includes HDP oxide and nitride.

A further aspect of the present disclosure is a method including: determining a correlation between a deformation shape of a top metal layer and a stress factor of an upper passivation layer of a sensor; and determining an overhang value based on the correlation, wherein the dimensions of a pad opening to be etched over a top metal layer in a region of a sensor is based on the overhang value.

Aspects of the present disclosure include the correlation based on FEA. Another aspect includes the predetermined overhang value is a measure of overlap between the top metal layer and a second passivation layer from the pad opening.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 2A through 2E schematically illustrate a process flow for forming a sensor with increased overhang to prevent passivation stress fractures, in accordance with exemplary embodiments;

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

Figure 1:
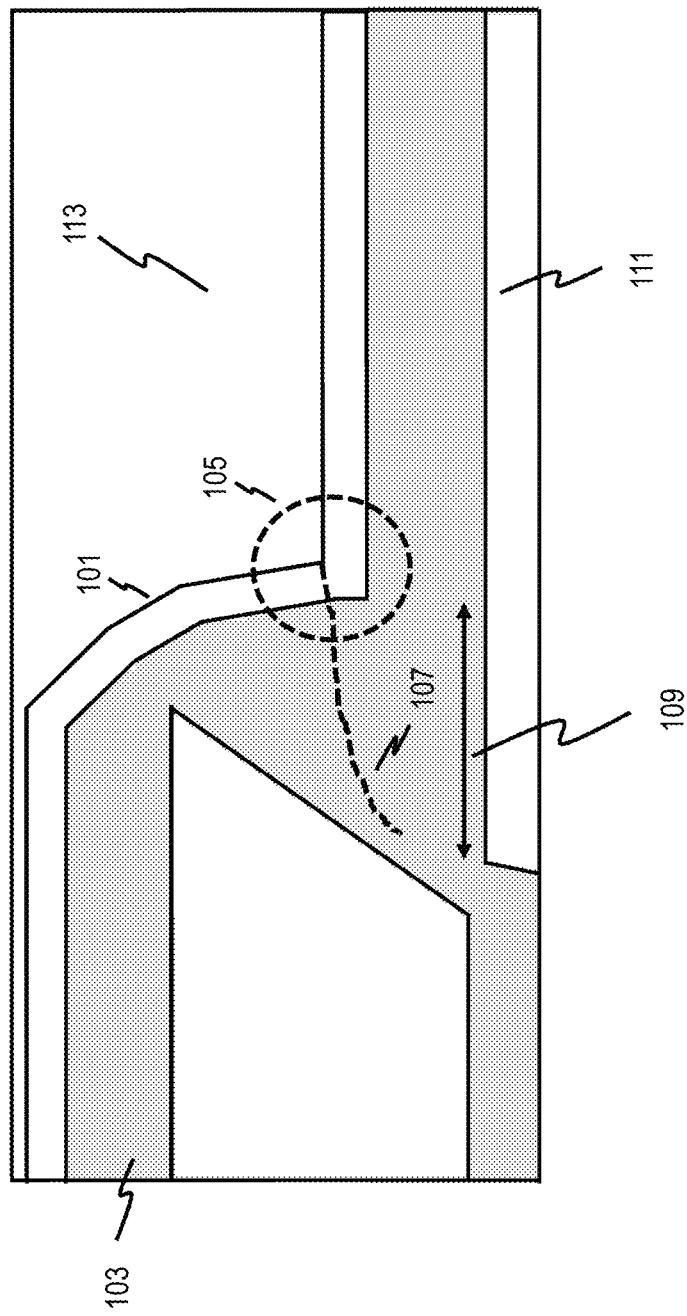
FIG. 1 (Background Art) schematically illustrates a cross-sectional view of a passivation scheme for a sensor device, in accordance with an exemplary embodiment.

The present disclosure addresses and solves the problem of preventing stress fractures from occurring in a passivation layer applied to a sensor device during device fabrication. Current sensors, such as those for supporting fingerprint scanning and other applications, require dual pad mask passivation. As depicted by way of example in the cross-sectional sensor view of FIG. 1 (Background Art), dual pad mask passivation typically requires a passivation layer 101 (e.g., silicon nitride (SiN)) to be deposited on top of a planarized passivation pattern (e.g., a HDP oxide such as silicon oxide (SiO or $SiO_2$)) formed over the various elements of sensor. The passivation layer 101 thus serves as an insulating, protective layer to prevent mechanical and chemical damage during assembly and packaging of the sensor.

Unfortunately, the thin (upper) passivation layer 101 deposited on the silicon oxide 103 is subject to much stress, which particularly occurs in a vulnerable area 105 of the passivation layer(s). This further leads to the formation of cracks/fractures 107 that degrade the integrity of the passivation layer and limit the performance of the sensor (e.g., receptivity to touch, sensibility).

This problem is solved, inter alia, by forming a sensor with increased overhang to prevent passivation stress fractures with minimal cost/manufacturing variation. As will be discussed later herein, increased overhang reduces the amount of stress that occurs in the most vulnerable sections, i.e., nitride bend/corner area 105 of the passivation layer. By way of example, overhang is an amount of overlapping area between a top metal layer 111 and a passivation layer. Thus, an overhang value 109 may be determined and/or expressed as a distance from the edge of the top/second applied passivation layer 101 from a pad opening 113 to the edge of a top metal layer 111 of the sensor.

Methodology in accordance with embodiments of the present disclosure includes forming a first passivation layer over a dielectric layer patterned over a first top metal layer of a logic region of a sensor and a second top metal layer of an array region of the sensor. The first passivation layer and the dielectric layer are planarized to form a level surface above the first top metal layer and the second top metal layer. The dielectric layer is etched to form a pad opening in the array region of the sensor based on a predetermined overhang value, the pad opening exposing a portion of the surface of the second top metal layer; and a second passivation layer is formed over the level surface and the pad opening in the array region.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 2A:
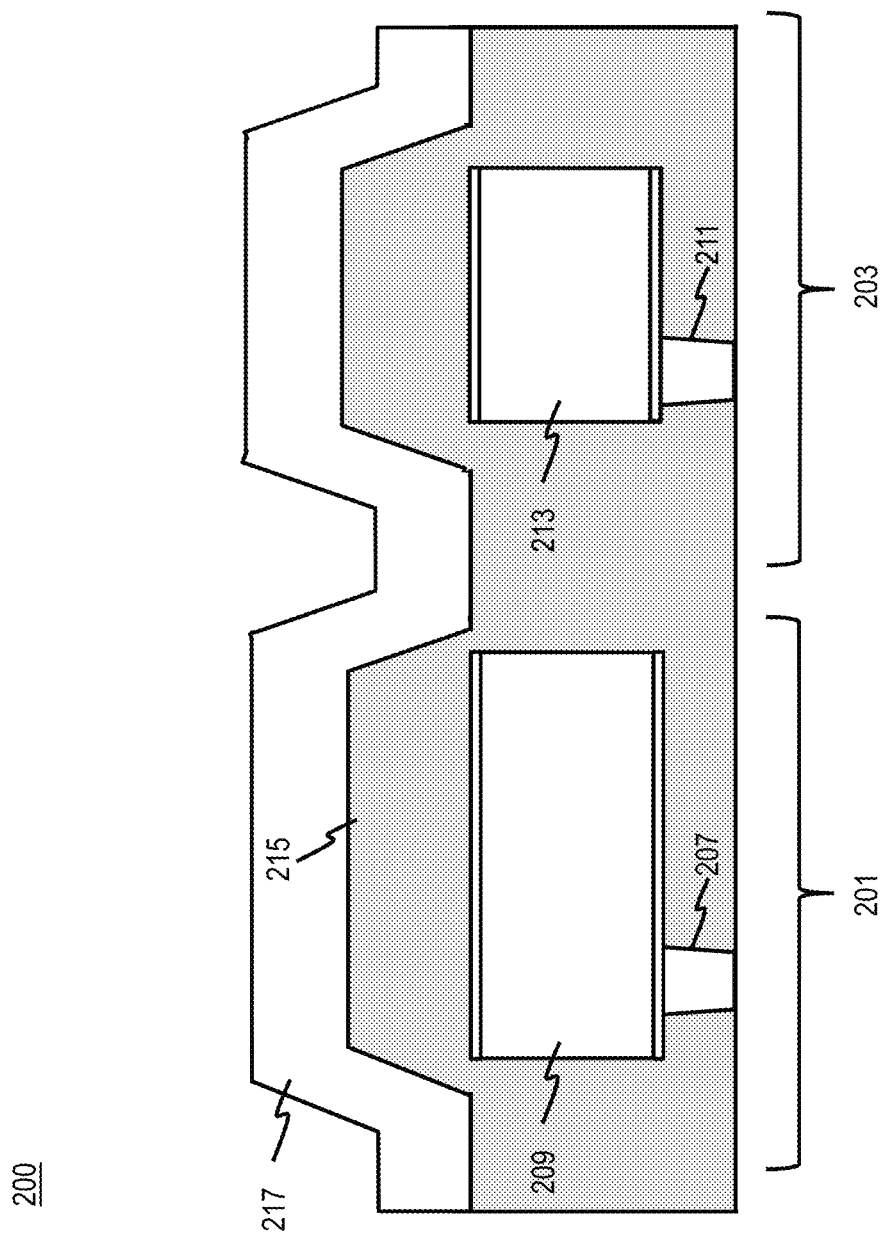

FIGS. 2A through 2E schematically illustrate a process flow for forming a sensor with increased overhang to prevent passivation stress fractures, in accordance with exemplary embodiments. The process flow for the passivation scheme is applied to a sensor device 200 as depicted in FIG. 2A.

In FIG. 2A, the sensor 200 is a semiconductor structure that includes a logic region 201 and array region 203. The logic region 201 corresponds to a function of the sensor 200 for interacting with logic elements (not shown for illustrative convenience) of an underlying semiconductor. An interconnection between the sensor 200 and an underlying logic element is formed by way of a via 207 that connects to a first top metal layer 209. The first top metal layer 209 serves as a sensing element or electrode, such as in the case of capacitive touch detection.

The array region 203 corresponds to a function of the sensor 200 for interacting with an array of other sensors (not shown for illustrative convenience). An interconnection between the sensor 200 and the underlying array is formed by way of via 211 and second top metal layer 213. The second top metal layer 213 serves as a sensing element or electrode, such as in the case of capacitive touch detection. It is contemplated, in certain embodiments, that the first and second top metal layers 209 and 213 respectively are formed as metal-insulator-metal structures includes various types of metal (e.g., aluminum) and/or capacitive elements. Still further, it is contemplated via 207 and 211 and respective top metal layers 209 and 213 may be formed according to known Damascene processing or back end of line (BEOL) processing techniques.

The first top metal layer 209 and second top metal layer 213 and their respective vias 207 and 211 are surrounded by a HDP oxide layer 215. In certain embodiments, the HDP oxide layer 215 is a dielectric layer and is formed as a silicon or doped silicon-based low-K dielectric, e.g., SiO or $SiO_2$, for separating the respective functions of the sensor 200. Hence, the logic region 201 may support interfacing of the sensor with corresponding sense perception (per array region 203) and/or determination logic (per logic region 201). Of note, the HDP oxide layer 215 may be patterned accordingly, per known etching and masking techniques, such that the height of the HDP oxide layer is greater over the first and second top metal layers 209 and 213 respectively.

Figure 2B:
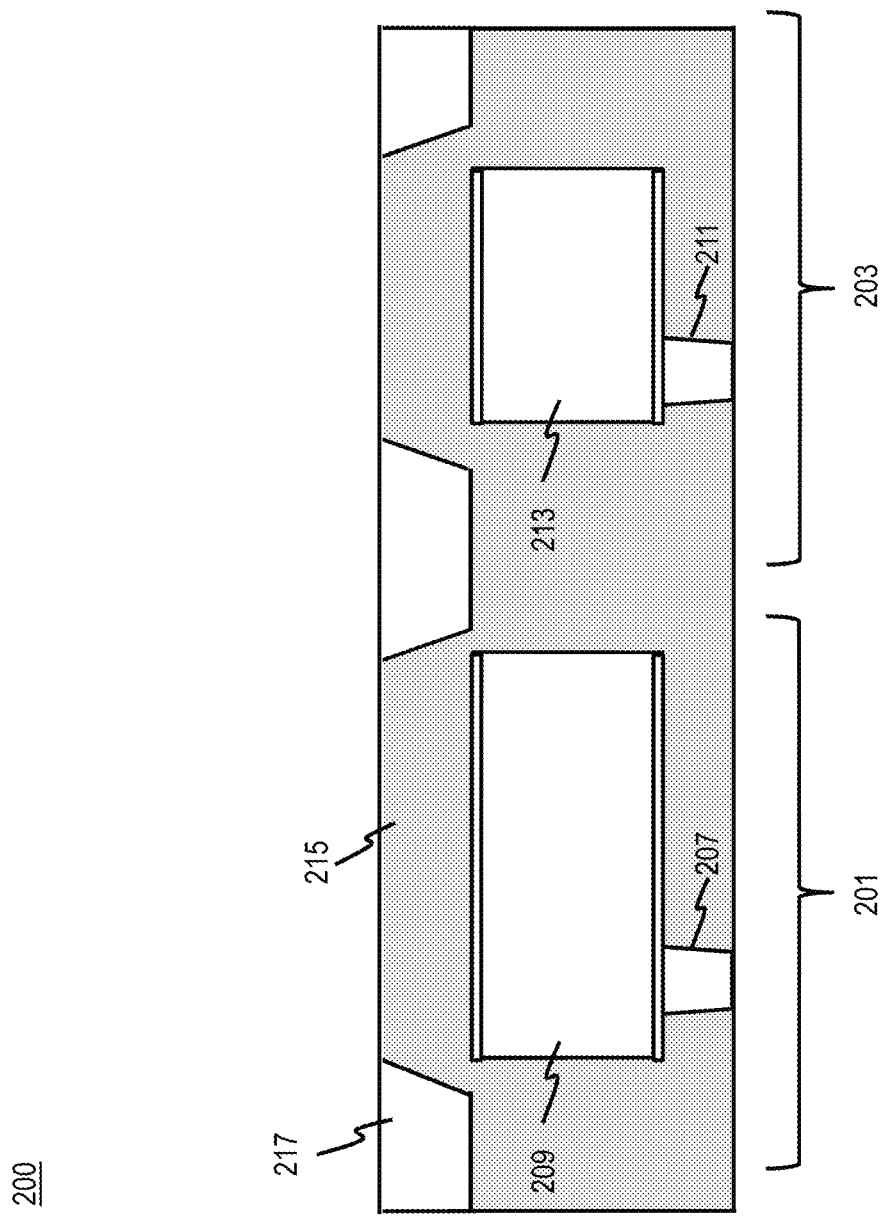

Per the exemplary passivation scheme, a first passivation layer 217 is formed over the HDP oxide layer 215 as patterned over the first top metal layer 209 of the logic region 201 and the second top metal layer 213 of the array region 203. By way of example, the first passivation layer 217 includes TEOS, TEOS ozone oxide or any other known material for supporting chemical-mechanical planarization. In another process step, the first passivation layer 217 and the HDP oxide layer 215 are planarized to form a level surface of the sensor 200, as depicted in FIG. 2B. Per this step, the height of the first passivation layer 217 and HDP oxide layer 215 above the surface of the first top metal layer 209 and second top metal layer 213 are identical.

In FIG. 2C, the HDP oxide layer 215 is etched to form a pad opening 219 in the array region 203 of the sensor 200 based on a predetermined overhang value. The pad opening 219 therefore exposes a portion of the surface of the second top metal layer 213 for enabling the sensing element or electrode to actively detect external stimuli (i.e., touch). In the exemplary embodiment, the dimensions of the pad opening 219 are defined based on the predetermined overhang value. As such, the surface area exposed per the pad opening 219 is variable relative to the fixed dimensions of the second top metal layer 213 of the array region 203.

Figure 2D:
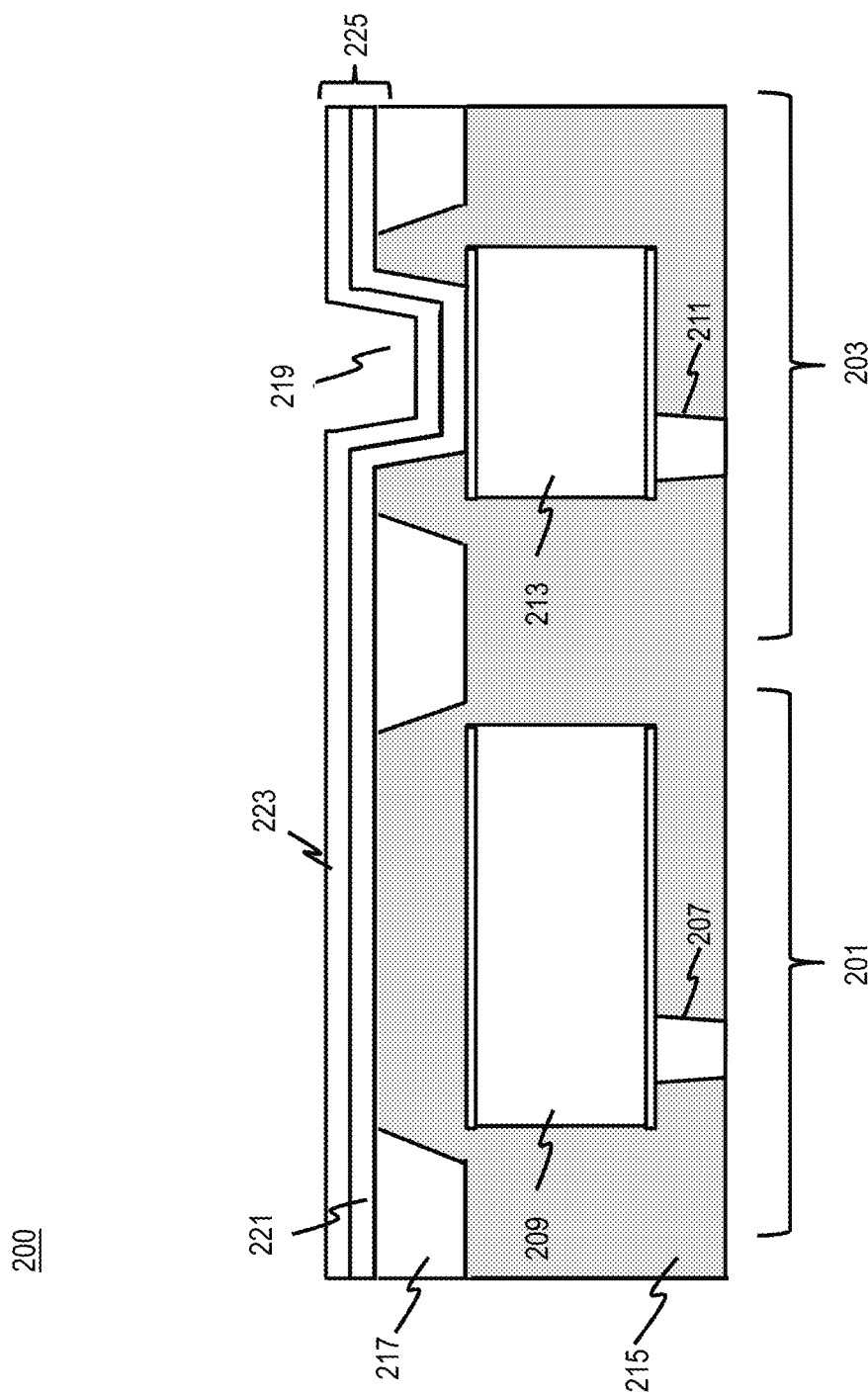

In certain embodiments, the overhang value is a measure of overlap between the second top metal layer 213 and a second passivation layer (e.g., layer 225 as shown in FIG. 2D) from the pad opening. The overhang value may be expressed as a distance (in micrometers) from the pad opening 219 to the edge of the second top metal layer 213, as an area value or area differential (e.g., area of the second top metal layer 213 minus the area of the pad opening 219), or the like. Moreover, the overhang value may be predetermined as an optimal value ahead of the sensor fabrication process based on FEA (e.g., per finite element methodology (FEM) or modeling) of known characteristic and/or response set data related to the passivation layer(s), the top metal layer(s) and other elements of the device 200. Per FEA or FEM, material characteristics, design requirements, and other elements of the sensor may be observed and correlated.

For example, the predetermined overhang value may be based on a correlation between a deformation shape of a given top metal layer and the second passivation layer resulting in an optimized stress factor (as observed in a nitride bend/corner area 105 of a second passivation layer). Based on this, an optimal value or range of values (e.g., 3-14 µm) for the overhang distance may be determined and adapted for different passivation schemes and sensor 200 types. It is noted, therefore, that the overhang value informs the etching process to ensure exact patterning of the HDP oxide layer 215 for formation of a pad opening 219 per any known etching means.

The etch process step depicted in FIG. 2C may further include performing a masking process. In this process, an etch mask is deposited over a portion of the HDP oxide layer 215 and the first passivation layer 217 prior to etching. Selective deposition of the etch mask ensures that only the portions of the sensor 200 that are not to be etched get masked, which is based on the dimensions of the pad opening 219 in the array region 203. Hence, the predetermined overhang value informs the masking process during device fabrication for specifying where the mask is, and is not, to be applied.

It is noted that the shape of the pad opening 219 as shown is for illustrative purposes only. The shape, size and general dimensions of the pad region 219 may vary as defined based on the predetermined overhang value. Per the process flow described in FIG. 2C, the resulting sensor 200 includes a level surfacing of the first passivation layer 217 and HDP oxide layer 215 with a single pad opening 219 in the array region 203.

In FIG. 2D, a second passivation layer 225 is formed over the level surface of both regions 201 and 203 and the pad opening 219 in the array region 203. The second passivation layer 225 is formed (deposited) as a HDP oxide layer 221 with an additional nitride layer 223 formed atop the HDP oxide layer 221. As the uppermost passivation layer, the second passivation layer 225 is of a thickness and material composition suitable for protecting the sensor 200, including the surface of the sense element/electrode (second top metal layer 213), from degradation due to external stimuli, i.e., contamination, moisture, etc.

Figure 2E:
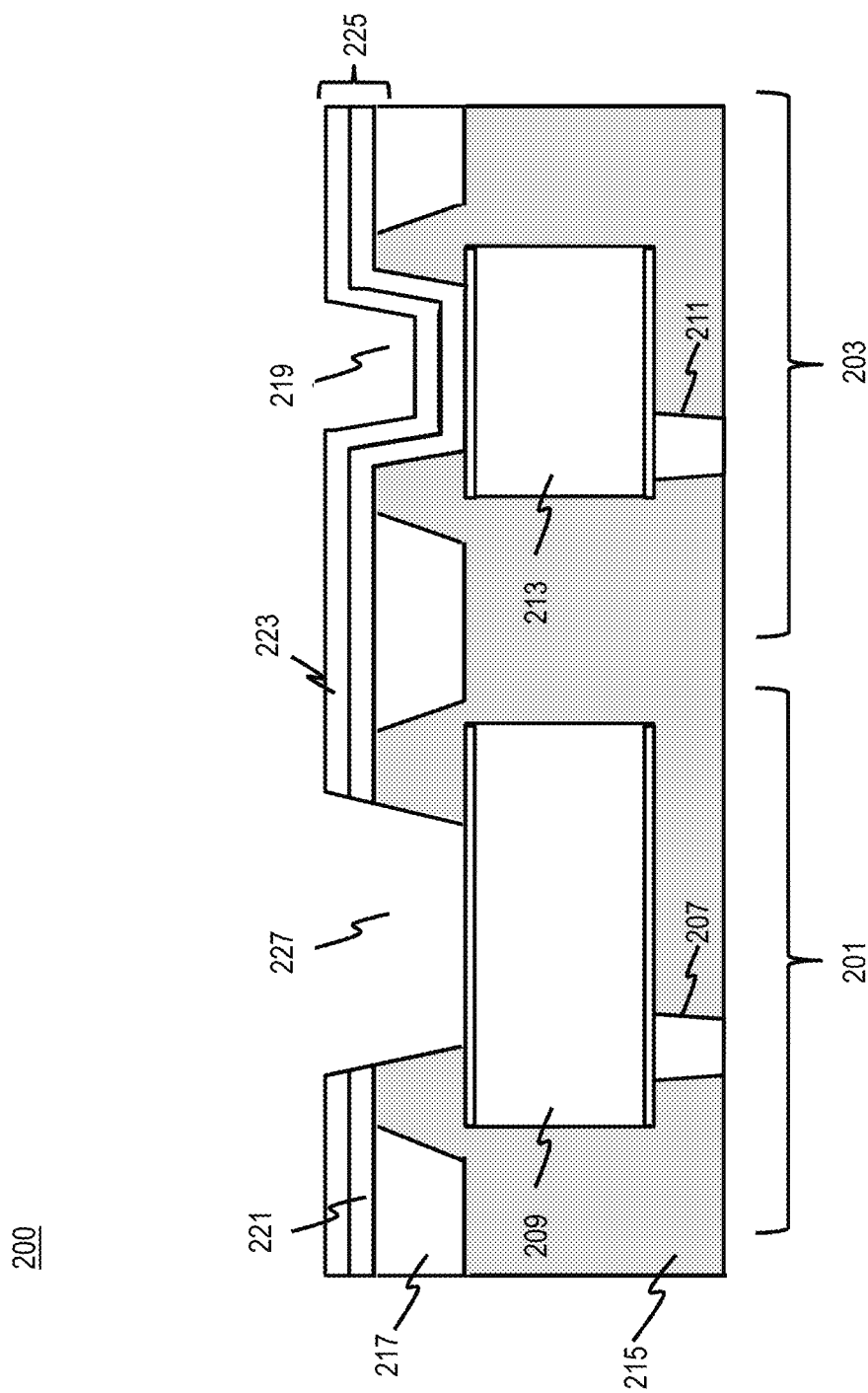

In FIG. 2E, the second passivation layer 225 and HDP oxide layer 215 under the second passivation layer 225 are etched to form a pad opening 227 in the logic region 201 of the sensor 200 based on the predetermined overhang value. The pad opening 227 therefore exposes a portion of the surface of the first top metal layer 209 for enabling the sensing element or electrode to actively detect external stimuli (i.e., touch). As described previously with respect to pad opening 219, the dimensions of the pad opening 227 are defined based on the predetermined overhang value. As such, the surface area exposed per the pad opening 227 is variable relative to the fixed dimensions of the first top metal layer 209 of the logic region 201. It is contemplated, in certain embodiments, that the predetermined overhang value for the array region 203 and logic region 201 may be identical or different depending on design and manufacturing requirements.

The etch process step depicted in FIG. 2E may further include performing a masking process. In this process, an etch mask is deposited over only the portion of the second passivation layer 225 not to be etched, i.e., no mask applied to the area of the second passivation layer 225 for patterning the pad opening 227. As described previously with respect to pad opening 219, selective masking is performed based on the dimensions of the pad opening 227.

Per the process flow described in FIG. 2E, the resulting sensor 200 includes dual pads, as defined by per pad openings 219 and 227. Furthermore, the pad opening 219 in the array region 203 has formed thereon the second passivation layer 225 while the pad opening 227 in the logic region 201 is fully exposed. In both regions 201 and 203, the respective pad openings 227 and 219 are formed based on the predetermined overhang value, thus preventing the occurrence of stress fractures within the second passivation layer 225. Of note, the process flow described herein enables the passivation stress response of the sensor 200 to be predetermined, planned and adapted for via overhang design and without any change in the manufacturing process.

Figure 3A:
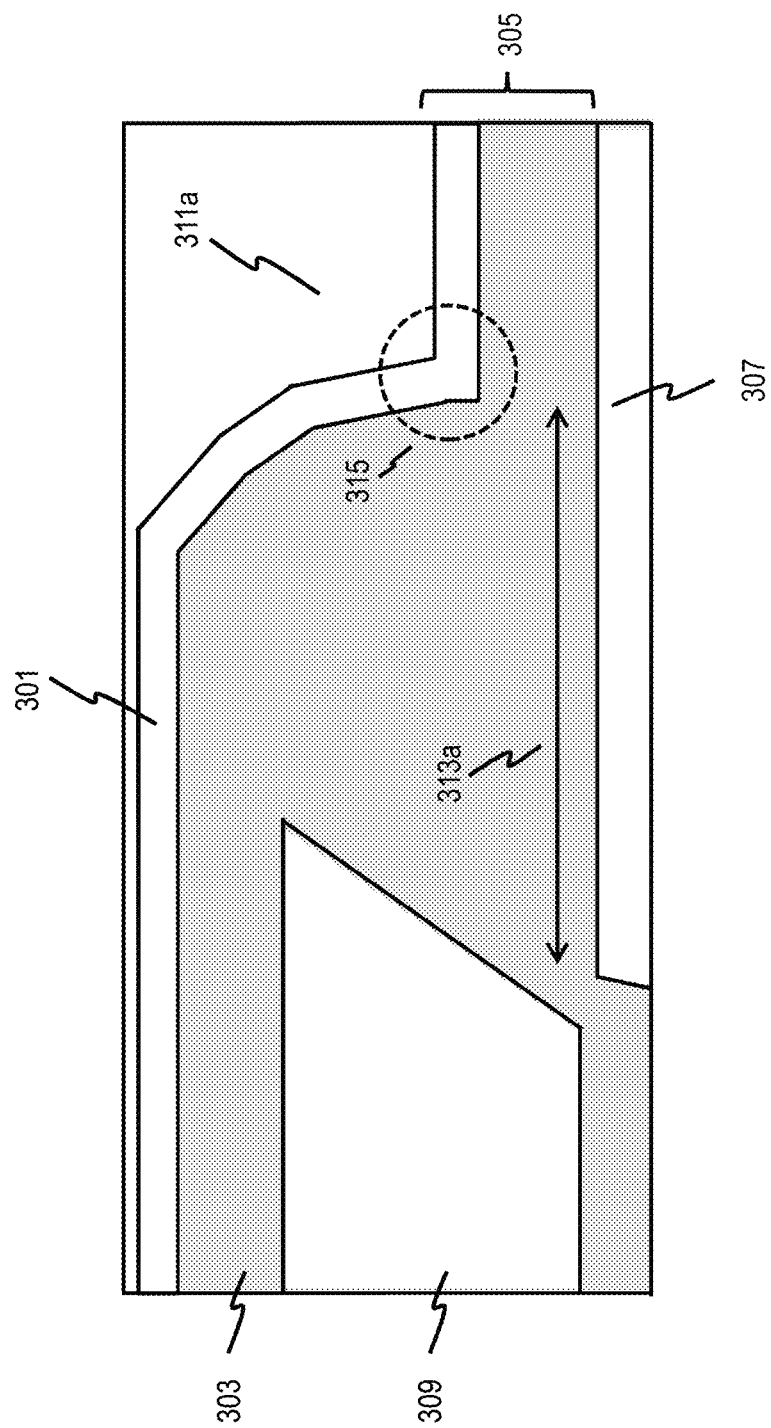
FIGS. 3A and 3B schematically illustrate a cross-sectional view of a passivation scheme for a sensor having increased overhang, in accordance with exemplary embodiments.
Figure 3B:
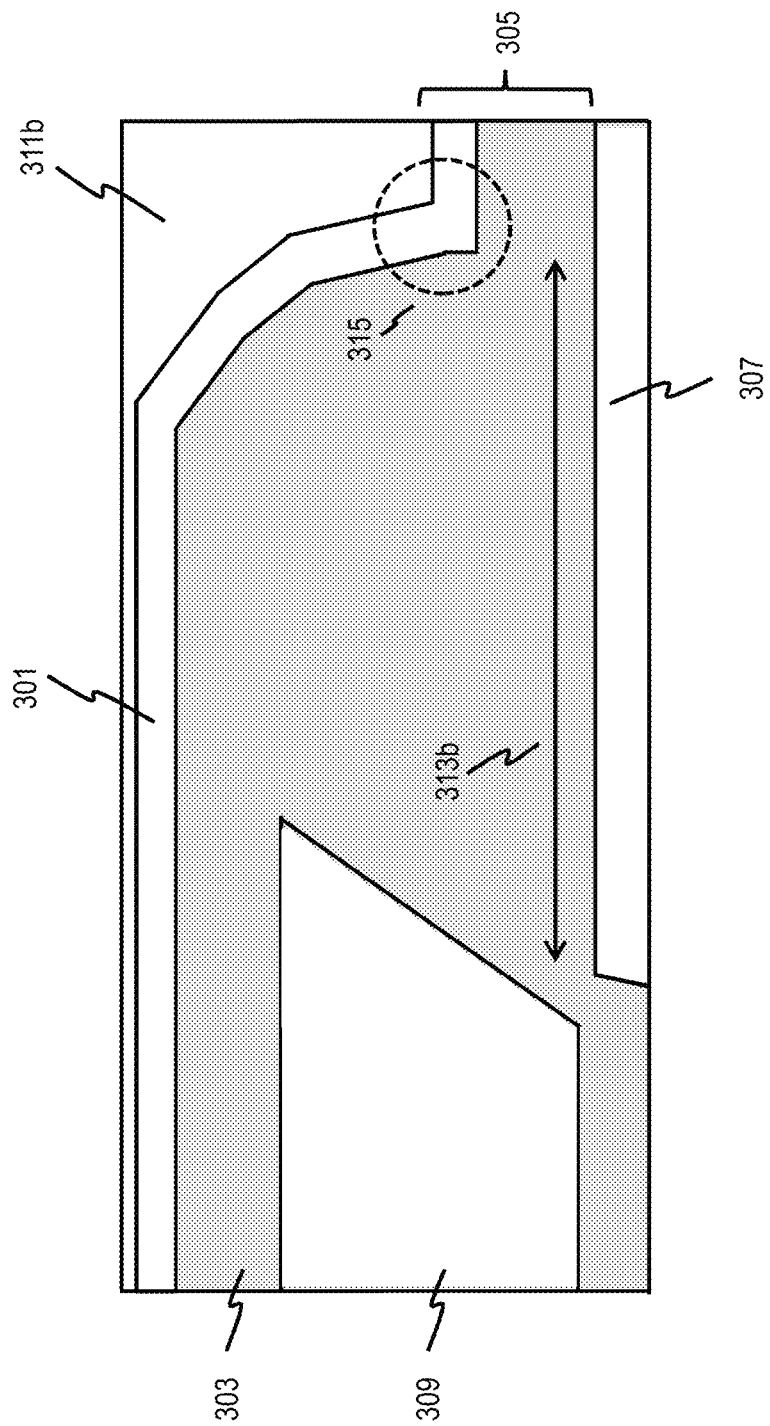

FIGS. 3A and 3B schematically illustrate a cross-sectional view of a passivation scheme for a sensor having increased overhang, in accordance with exemplary embodiments. In FIG. 3A, the second passivation layer 305 includes a HDP oxide layer 303 and nitride layer 301 formed over a top metal layer 307 of a sensor and a planarized, first passivation layer 309 formed of TEOS. The second passivation layer 305 is also formed over a pad opening 311a. The distance 313a from the pad opening 311a to the edge of the top metal layer 307, referred to herein as overhang, is lengthened.

Figure 3D:
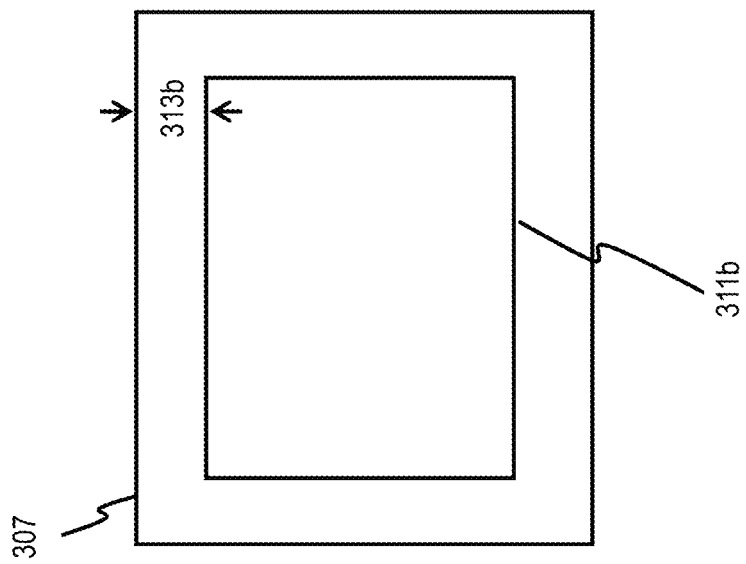
FIGS. 3C and 3D schematically illustrate a top view of a passivation scheme for a sensor having increased overhang, in accordance with an exemplary embodiment.
Figure 3C:
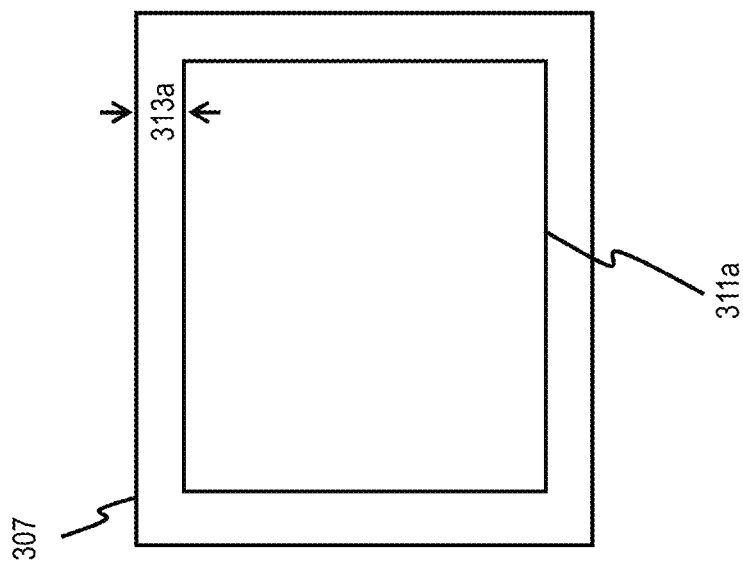

A top view of the passivation scheme depicted above, with lengthened overhang 313a, is shown in FIG. 3C. In FIG. 3C, the second passivation layer 305 (formed over the pad opening 311a) overlaps the top metal layer (M5 layer) 307. The dimensions of the pad opening 311a are defined by the overhang value 313a as measured in micrometers (μ). In this example, the overhang value is equal on each overlapping side. Alternatively, the overhang may be measured in square units (e.g., $\mu^2$) for representing an area differential between the top metal layer 307 and the area of pad opening 311a. Still further, in an alternate embodiment, the overhang value may be different on different overlapping sides. In the latter scenario, multiple predetermined overhang values may be selected in advance of the sensor fabrication process per FEA.

In FIG. 3B, the distance 313b from the pad opening 311a to the edge of the top metal layer 307 is lengthened. This is depicted in the corresponding top view of FIG. 3D, which shows increased dimensions of the pad opening 311b as defined by longer overhang value 313b. The increased overhang minimizes the stress response at the bend/corner area 315 of the second passivation layer 305. This contrasts with the overhang value 109 of FIG. 1 (Background Art), wherein the shorter distance increases the amount of stress that occurs at a bend/corner area 105. It is noted, in this example, that the increased overhang 313b corresponds to decreased dimensions and/or area of the pad opening 311b. As such, the reduced size of the opening may be accounted for in advance, i.e., based on the predetermined overhang value, to support sensor design and planning.

The embodiments of the present disclosure can achieve several technical effects including preventing stress fractures from occurring in a passivation layer formed over a sensor. Furthermore, the present disclosure enables a predetermined (optimal) overhang value or range to be determined for planning, designing and manufacturing a sensor. Still further, the present disclosure supports the development of sensors with increased overhang with no adverse impact to cost or sensor performance. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure enjoys industrial applicability in any of various types of semiconductor devices including MRAMs, ReRAMs and FeRAMs.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

The invention claimed is:

1. A device comprising:
a first top metal layer within a logic region of a sensor;
a second top metal layer within an array region of the sensor;
a dielectric layer over the logic region and the array region, height of the dielectric layer over the first and second top metal layers greater than the height of the dielectric layer in-between the first and second top metal layers;
a first passivation layer over the dielectric layer, the first passivation layer being in-between the first and second top metal layers, and a height of the first passivation layer being level with the height of the dielectric layer over the first and second top metal layers;
a pad opening in the logic region of the sensor with dimensions based on a predetermined overhang value, the pad opening exposing the first op metal layer;
a pad opening in the array region of the sensor with dimensions based on the predetermined overhang value; and
a second passivation layer over the dielectric layer, the first passivation layer and the pad opening in the array region of the sensor.

2. The device according to claim 1, further comprising:
a via connected to a bottom surface of the first top metal layer, the via interconnecting the sensor to a logic device; and
a via connected to a bottom surface of the second top metal layer, the via interconnecting the sensor to an array,
wherein the dielectric layer is over the via, and wherein the dielectric layer comprises of high-density plasma (HDP) oxide, silicon or doped silicon-based low-K dielectric.

3. The device according to claim 1, further comprising:
an etch mask over a portion of the dielectric layer and the first passivation layer,
wherein h portion is based on the dimensions of the pad opening in the array region of the sensor.

4. The device according to claim 1, further comprising:
an etch mask over a portion of the second passivation layer,
wherein the portion is based on the dimensions of the pad opening in the logic region of the sensor.

5. The device according to claim 1, wherein the predetermined overhang value is a measure of overlap between the second top metal layer and the second passivation layer from the pad opening in the array region.

6. The device according to claim 1, wherein the predetermined overhang value is a measure of overlap between the first top me a layer and the second passivation layer from the pad opening in the logic region.

7. The device according to claim 1, wherein the first passivation layer comprises of tetraethoxysilane (TEOS) and the second passivation layer comprises of HDP oxide and nitride.

* * * * *